United States Patent
Wang et al.

(10) Patent No.: US 10,701,195 B2
(45) Date of Patent: Jun. 30, 2020

(54) METAL REAR COVER FOR TERMINAL AND TERMINAL

(71) Applicant: GUANGDONG OPPO MOBILE TELECOMMUNICATIONS CORP., LTD., Dongguan (CN)

(72) Inventors: Xinbao Wang, Dongguan (CN); Shengzhao Xiang, Dongguan (CN); Ning Zhao, Dongguan (CN); Liang Gu, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/752,741

(22) PCT Filed: Mar. 18, 2017

(86) PCT No.: PCT/CN2017/077166
§ 371 (c)(1),
(2) Date: Feb. 14, 2018

(87) PCT Pub. No.: WO2017/157346
PCT Pub. Date: Sep. 21, 2017

(65) Prior Publication Data
US 2018/0241857 A1    Aug. 23, 2018

(30) Foreign Application Priority Data
Mar. 18, 2016  (CN) .......................... 2016 1 0161748

(51) Int. Cl.
*H04M 1/02*  (2006.01)
*H01Q 1/44*  (2006.01)
(Continued)

(52) U.S. Cl.
CPC ........ *H04M 1/0249* (2013.01); *G06F 1/1656* (2013.01); *G06F 1/1698* (2013.01);
(Continued)

(58) Field of Classification Search
CPC ............ H01Q 1/36; H01Q 1/243; H01Q 1/44; H01Q 5/321; H01Q 5/10; H01Q 5/335;
(Continued)

(56) References Cited

U.S. PATENT DOCUMENTS 9,641,211 B2 *  5/2017  Wu ........................ H04B 1/3888
9,762,710 B2 *  9/2017  Lee ......................... H01Q 1/243
(Continued)

FOREIGN PATENT DOCUMENTS

| CN | 103390796 A | 11/2013 |
|----|-------------|---------|
| CN | 103401059 A | 11/2013 |

(Continued)

OTHER PUBLICATIONS

English translation of CN105322290, Zhang Yunliang, Antenna structure and wireless device, Feb. 10, 2016 (Year: 2016).*
(Continued)

*Primary Examiner* — Jinsong Hu
*Assistant Examiner* — Rui M Hu
(74) *Attorney, Agent, or Firm* — Lathrop GPM LLP

(57) ABSTRACT

A metal rear cover for the terminal (100) and a terminal are provided. The metal rear cover for the terminal (100) includes a base plate (10) provided with at least one micro-seam band (20), the micro-seam band (20) is provided with a plurality of micro-seams (21), and the at least one micro-seam band (20) divides the base plate (10) into at least two radiation parts (30). At least one of the at least two radiation parts (30) is configured to be coupled to a matching circuit (1) and to receive a feeding signal via the matching circuit (1).

8 Claims, 4 Drawing Sheets

(51) Int. Cl.
H01Q 1/24 (2006.01)
H05K 5/04 (2006.01)
H01Q 5/335 (2015.01)
G06F 1/16 (2006.01)
H01Q 7/00 (2006.01)
H01Q 21/30 (2006.01)
H04B 1/3827 (2015.01)

(52) U.S. Cl.
CPC .............. *H01Q 1/243* (2013.01); *H01Q 1/44* (2013.01); *H01Q 5/335* (2015.01); *H01Q 7/00* (2013.01); *H01Q 21/30* (2013.01); *H04B 1/3833* (2013.01); *H04M 1/0283* (2013.01); *H05K 5/04* (2013.01)

(58) Field of Classification Search
CPC ....... H01Q 7/00; H01Q 21/30; H04M 1/0249; H04M 1/0283; H05K 5/04; H04B 1/3833; G06F 1/1656; G06F 1/1698
See application file for complete search history.

(56) References Cited

U.S. PATENT DOCUMENTS

| | | | | |
|---|---|---|---|---|
| 9,768,506 | B2* | 9/2017 | Krogerus | H01Q 5/30 |
| 9,794,382 | B2* | 10/2017 | Yang | H04M 1/0249 |
| 9,882,275 | B2* | 1/2018 | Rubin | H01Q 21/28 |
| 2012/0112970 | A1* | 5/2012 | Caballero | H01Q 7/00 343/702 |
| 2012/0139812 | A1* | 6/2012 | Ito | H01Q 1/243 343/853 |
| 2012/0262357 | A1* | 10/2012 | Kato | H01P 11/001 343/788 |
| 2013/0203364 | A1* | 8/2013 | Darnell | H01Q 1/243 455/77 |
| 2014/0078008 | A1* | 3/2014 | Kang | H01Q 5/35 343/702 |
| 2014/0125528 | A1* | 5/2014 | Tsai | H01Q 1/243 343/702 |
| 2014/0139380 | A1* | 5/2014 | Ouyang | H01Q 7/00 343/702 |
| 2014/0274231 | A1* | 9/2014 | De Luis | H01Q 5/321 455/575.7 |
| 2014/0327584 | A1* | 11/2014 | Chang | H01Q 1/243 343/702 |
| 2015/0050968 | A1* | 2/2015 | Jeon | C25D 5/48 455/575.1 |
| 2016/0111795 | A1* | 4/2016 | Ishikawa | H01Q 1/2216 343/867 |
| 2016/0116948 | A1* | 4/2016 | Ou | G06F 1/1698 361/679.56 |
| 2016/0134730 | A1* | 5/2016 | Lee | H04M 1/026 455/552.1 |
| 2016/0164166 | A1* | 6/2016 | Lee | H01Q 1/243 343/702 |
| 2016/0285151 | A1* | 9/2016 | Lee | H01Q 1/242 |
| 2017/0149118 | A1* | 5/2017 | Wang | H01Q 1/243 |
| 2017/0179591 | A1* | 6/2017 | Kuang | H01Q 13/103 |
| 2017/0194709 | A1* | 7/2017 | Jansson | H01Q 9/04 |
| 2018/0083343 | A1* | 3/2018 | Choon | H04M 1/0202 |
| 2018/0083345 | A1* | 3/2018 | Zhao | H01Q 5/335 |
| 2018/0248253 | A1* | 8/2018 | Hu | H01Q 1/36 |
| 2018/0254543 | A1* | 9/2018 | Wang | H01Q 1/38 |
| 2018/0301792 | A1* | 10/2018 | Park | H01Q 7/00 |
| 2019/0237853 | A1* | 8/2019 | Hu | H01Q 5/335 |

FOREIGN PATENT DOCUMENTS

| | | |
|---|---|---|
| CN | 203775569 U | 8/2014 |
| CN | 104377424 A | 2/2015 |
| CN | 104540341 A | 4/2015 |
| CN | 104580585 A | 4/2015 |
| CN | 104584324 A | 4/2015 |
| CN | 104640391 A | 5/2015 |
| CN | 105098352 A | 11/2015 |
| CN | 105119050 A | 12/2015 |
| CN | 105322290 A | 2/2016 |
| CN | 105655706 A | 6/2016 |
| CN | 205583140 U | 9/2016 |
| EP | 2405534 A1 | 1/2012 |
| WO | WO 2015143705 A1 | 10/2015 |

OTHER PUBLICATIONS

PCT/CN2017/077166 English translation of International Search Report dated Jun. 19, 2017, 2 pages.
PCT/CN2017/077166 International Search Report and Written Opinion dated Jun. 19, 2017, 12 pages.
Chinese Patent Application No. 201610161748.9, First Office Action dated Jun. 5, 2017, 6 pages.
Chinese Patent Application No. 201610161748.9, English translation of the First Office Action dated Jun. 5, 2017, 8 pages.
Chinese Patent Application No. 201610161748.9, Second Office Action dated Aug. 16, 2017, 7 pages.
Chinese Patent Application No. 201610161748.9, English translation of the Second Office Action dated Aug. 16, 2017, 10 pages.
Chinese Patent Application No. 201610161748.9, Third Office Action dated Oct. 23, 2017, 3 pages.
Chinese Patent Application No. 201610161748.9, English translation of the Third Office Action dated Oct. 23, 2017, 5 pages.
Chinese Patent Application No. 201711388853.7, First Office Action dated Jun. 10, 2019, 11 pages.
Chinese Patent Application No. 201711388853.7, English translation of First Office Action dated Jun. 10, 2019, 12 pages.
Indian Patent Application No. 201837008254, Office Action dated Nov. 21, 2019, 6 pages.

* cited by examiner

US 10,701,195 B2

METAL REAR COVER FOR TERMINAL AND TERMINAL

CROSS-REFERENCE TO RELATED APPLICATION

This application is a national phase entry under 35 USC § 371 of International Application PCT/CN2017/077166, filed Mar. 18, 2017, which is based on and claims a priority to Chinese Patent Application Serial No. 201610161748.9, filed Mar. 18, 2016, the entire contents of which are incorporated herein by reference.

FIELD

The present disclosure relates to a field of electronic devices, more particularly to a metal rear cover for a terminal and a terminal.

BACKGROUND

At present, a metal rear cover of a mobile phone is generally provided with two plastic isolation strips to divide the metal rear cover into three segments of metal parts, so that a radio frequency efficiency of an antenna within the mobile phone can be improved by means of slits among the metal parts. However, as the user has increasingly higher appearance requirements of the mobile phone, a proportion of the metal portion of the metal rear cover of the mobile phone is required to increase, thus resulting in a decrease of a proportion of the plastic isolation strip. In this case, with the decrease of the proportion of the plastic isolation strip, the radio frequency efficiency of the antenna within the mobile phone is reduced, thus affecting a user experience of the mobile phone.

SUMMARY

In view of this, the present disclosure provides a metal rear cover for a terminal and a terminal, which can improve a user experience.

The present disclosure provides a metal rear cover for a terminal. The metal rear cover for the terminal includes a base plate provided with at least one micro-seam band, the micro-seam band is provided with a plurality of micro-seams, the at least one micro-seam band divides the base plate into at least two radiation parts, and at least one of the at least two radiation parts is configured to be coupled a matching circuit and to receive a feeding signal via the matching circuit.

The present disclosure provides another metal rear cover for a terminal The metal rear cover for the terminal includes a base plate and a conducting switch. The base plate is provided with at least one micro-seam band, and the at least one micro-seam band divides the base plate into at least two radiation parts. At least one of the at least two radiation parts is configured to be coupled to a matching circuit and to receive a feeding signal via the matching circuit. The conducting switch is coupled between the at least two radiation parts, and configured to disconnect or connect the at least two radiation parts.

The present disclosure further provides a terminal The terminal includes a metal rear cover, a front cover and a mainboard. The metal rear cover includes a base plate provided with at least one micro-seam band, and the at least one micro-seam band divides the base plate into at least two radiation parts. At least one of the at least two radiation parts is configured to be coupled to a matching circuit and to receive a feeding signal via the matching circuit. The front cover and the metal rear cover are coupled to and cover each other. The mainboard is fixed between the front cover and the metal rear cover, and the mainboard is provided with the matching circuit electrically coupled to the at least one of the at least two radiation parts.

BRIEF DESCRIPTION OF THE DRAWINGS

To describe technical solutions in embodiments of the present disclosure more clearly, the accompanying drawings required for the description of the embodiments will be briefly introduced in the following. Obviously, the accompanying drawings described below only show some embodiments of the present disclosure, and those skilled in the art can obtain other drawings based on these drawings without paying creative efforts.

DETAILED DESCRIPTION

Technical solutions in embodiments of the present disclosure will be clearly and completely described below with reference to the accompanying drawings in the embodiments of the present disclosure.

Figure 1:
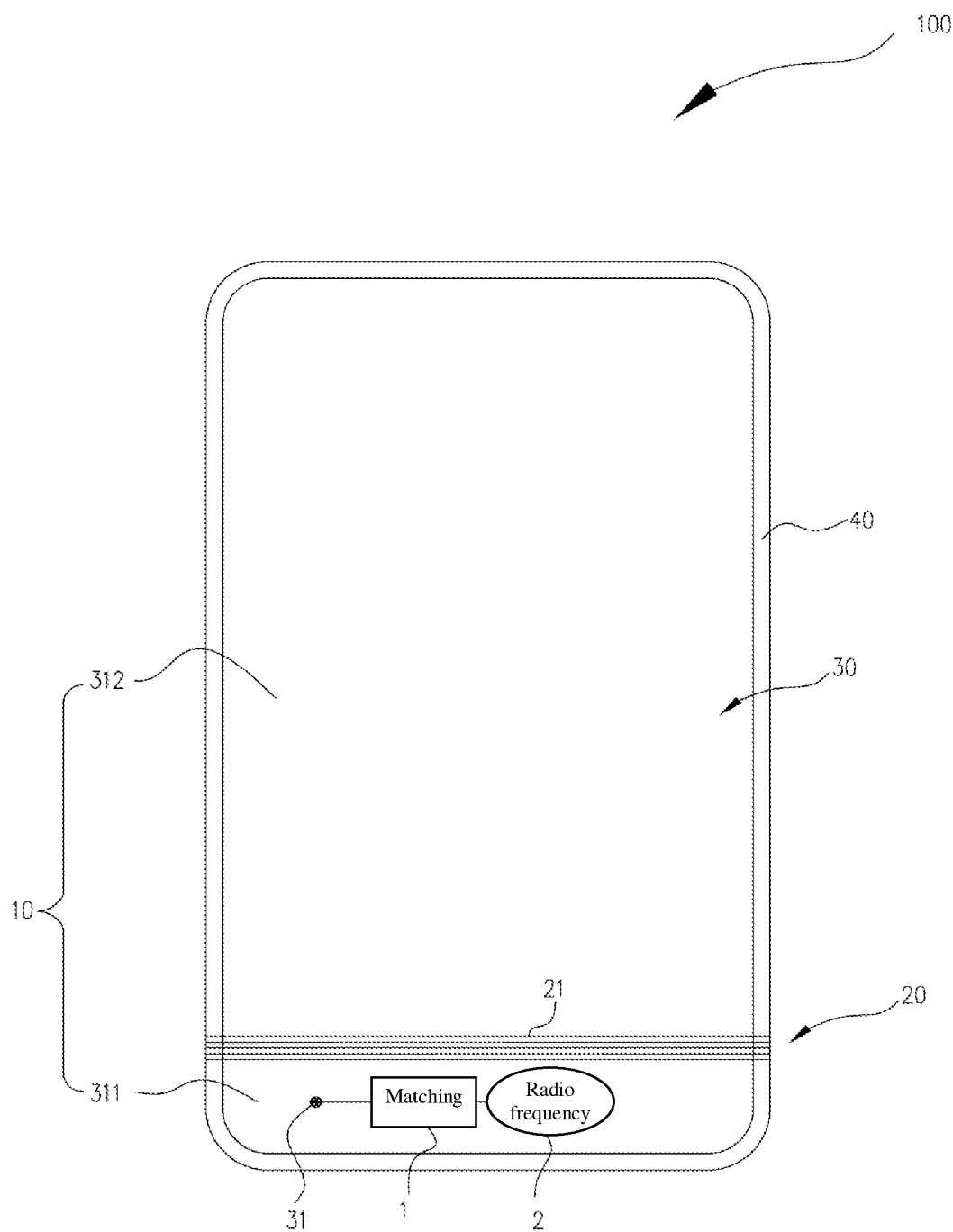
FIG. 1 is a schematic view of a metal rear cover for the terminal according to a first embodiment of the present disclosure.

As illustrated in FIG. 1, the present disclosure provides a metal rear cover 100 for a terminal The metal rear cover 100 for the terminal includes a base plate 10 provided with at least one micro-seam band 20, and the micro-seam band 20 includes a plurality of micro-seams 21. The at least one micro-seam band 20 divides the base plate 10 into at least two radiation parts 30, and at least one of the at least two radiation parts 30 is configured to be coupled to a matching circuit 1 and to emit an electromagnetic wave. In some embodiments of the present disclosure, the metal rear cover for the terminal can be applied to a terminal, serving as a rear cover of the terminal so as to protect the terminal, and can be fitted with a display panel of the terminal to form a housing of the terminal The terminal can be a mobile phone, a tablet computer, a notebook computer or the like.

By providing the at least one micro-seam band 20 to the base plate 10 of the metal rear cover 100 for the terminal, the at least one micro-seam band 20 divides the base plate 10 into at least two radiation parts 30. By providing the micro-seam band 20 with the plurality of micro-seams 21, a proportion of a non-metal portion of the metal rear cover 100 for the terminal is reduced. At least one of the radiation parts 30 is coupled to the matching circuit 1, to radiate the electromagnetic wave, such that the metal rear cover 100 for the terminal itself can achieve a radio frequency of an antenna, and a radio frequency efficiency of the antenna is improved. Moreover, under the premise of satisfying overall appearance requirements of the terminal, the radio frequency efficiency of the antenna is improved, thereby improving a user experience.

In some embodiments of the present disclosure, the base plate 10 is a rectangular plate member. The base plate 10 can bear a mainboard and other functional components in the terminal at an inner side of the base plate 10, and can protect the mainboard and the functional components. The micro-seam band 20 can be formed by means of laser cutting. The radiation part 30 is a metal sheet formed due to the dividing of the micro-seam band 20. The radiation part 30 coupled to the matching circuit 1 is provided with a feeding point 31, and the feeding point 31 is coupled to the matching circuit 1, so that the radiation part 30 can receive a feeding signal, and can generate the electromagnetic wave, thereby resulting in the radio frequency of the antenna. The matching circuit 1 can be disposed to the mainboard of the terminal. The matching circuit 1 is configured to regulate an impedance matching of the radiation part 30, so that a radio frequency signal of the radiation part 30 can be stable, thus improving the radio frequency efficiency of the antenna. The radiation part 30 coupled to the matching circuit 1 can also be coupled to a radio frequency transceiving circuit 2. The matching circuit 1 is provided between the radio frequency transceiving circuit and the radiation part 30.

Further, as illustrated in FIG. 1 again, a first embodiment is provided, and the base plate 10 is provided with one micro-seam band 20. The micro-seam band 20 extends along a width direction of the base plate 10, and the one micro-seam band 20 divides the base plate 10 into two radiation parts 30. The micro-seam band 20 is adjacent to one side edge of the base plate 10 along a length direction of the base plate 10. Further, when the metal rear cover 100 for the terminal is applied to the terminal, the micro-seam band 20 can be located at a bottom of the terminal, so that the matching circuit 1 can be conveniently provided at the bottom of the terminal, and the matching circuit 1 can be coupled to the radiation part 30 at the bottom of the terminal, thus fully utilizing a bottom space of the terminal and hence reducing a thickness of the terminal. In some embodiments of the present disclosure, the micro-seam band 20 divides the base plate 10 into a first radiation part 311 and a second radiation part 312, and an area of the first radiation part 311 is smaller than an area of the second radiation part 312. The first radiation part 311 is coupled to the matching circuit 1, and the second radiation part 312 is isolated from the first radiation part 311. When the metal rear cover 100 for the terminal is applied to the terminal, the first radiation part 311 is located at the bottom of the terminal. In other embodiments, the first radiation part 311 can also be provided at a top of the terminal; the second radiation part 312 can also be coupled to another matching circuit, so that the metal rear cover 100 for the terminal can achieve two radio frequency ranges, thus broadening a radio frequency bandwidth of the antenna; and the micro-seam band 20 can also extend along the length direction of the base plate 10.

Figure 2:
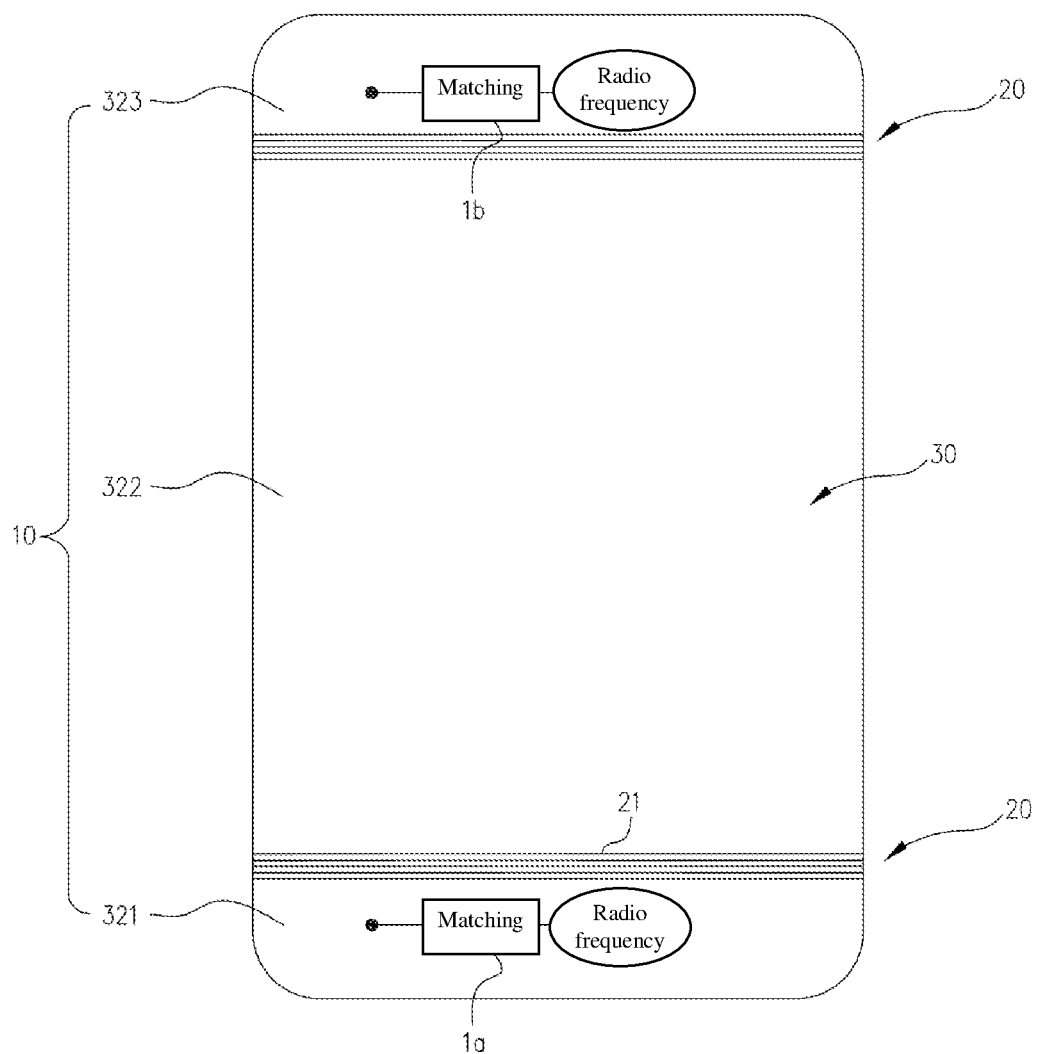
FIG. 2 is a schematic view of a metal rear cover for the terminal according to a second embodiment of the present disclosure.

As illustrated in FIG. 2, a second embodiment substantially identical to the first embodiment is provided, but differs from the first embodiment in that the base plate 10 is provided with two micro-seam bands 20. The two micro-seam bands 20 are adjacent to two side edges of the base plate 10 along the length direction of the base plate 10, respectively. That is, one micro-seam band 20 is adjacent to a side edge of the base plate 10 in the length direction of the base plate 10, and the other micro-seam band 20 is adjacent to another side edge of the base plate 10 opposite to the above side edge of the base plate 10. In some embodiments of the present disclosure, the two micro-seam bands 20 divide the base plate 10 into a first radiation part 321, a second radiation part 322 and a third radiation part 323 arranged sequentially. The two micro-seam bands 20 are parallel to each other. The first radiation part 321 is coupled to a first matching circuit 1a and the third radiation part 323 is coupled to a second matching circuit 1b, respectively. The second radiation part 322 is coupled with the first radiation part 321 and the third radiation part 323, so that a radio frequency range of the first radiation part 321 is different from a radio frequency range of the third radiation part 323. Furthermore, the second radiation part 322 can be grounded, so that the second radiation part 322 is coupled between the first radiation part 321 and the third radiation part 323 and also generates the radio frequency, so that the metal rear cover 100 for the terminal can further generate a plurality of radio frequency ranges, thus broadening the radio frequency bandwidth and improving the radio frequency efficiency. In other embodiments, it is also possible that the first radiation part 321 is provided with a ground point isolated from the feeding point 31, the ground point is coupled to a grounding electrode, so that the radio frequency bandwidth of the first radiation part 321 can be broadened; or the third radiation part 323 is also grounded, that is, at least one of the at least two radiation parts 30 is grounded.

Figure 3:
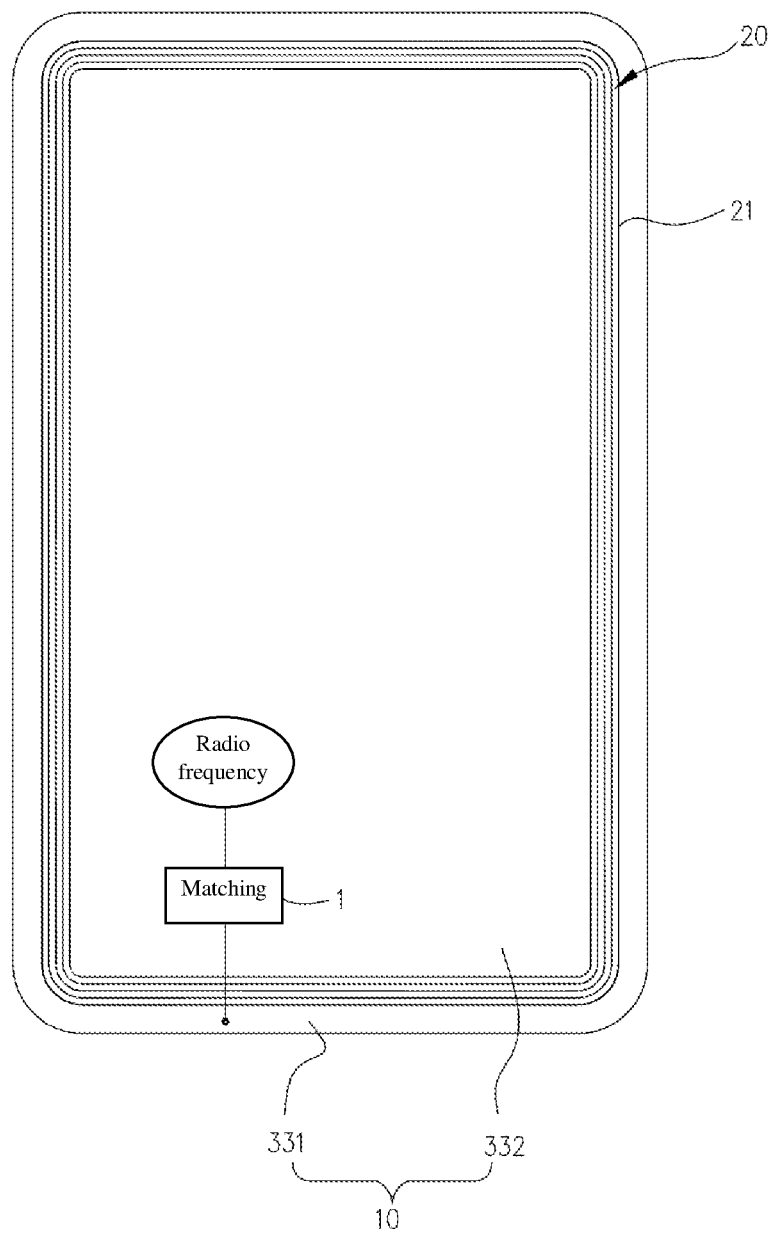
FIG. 3 is a schematic view of a metal rear cover for the terminal according to a third embodiment of the present disclosure.

As illustrated in FIG. 3, a third embodiment substantially identical to the first embodiment is provided, but differs from the first embodiment in that the at least one micro-seam band 20 is annularly provided along a direction parallel to a circumferential direction of the base plate 10. The at least one micro-seam band 20 includes one micro-seam band 20, and the one micro-seam band 20 divides the base plate 10 into a first radiation part 331 located at a circumferential edge of the base plate 10, and a second radiation part 322 located inside the first radiation part 331. The first radiation part 331 is coupled to the matching circuit 1. Therefore, the first radiation part 331 constitutes a loop antenna, and the metal rear cover 100 for the terminal can achieve transceiving of special radio frequency ranges. Furthermore, a metal strip between two adjacent micro-seams 21 within the micro-seam band 20 constitutes an annular wire, and a plurality of metal strips among the micro-seams 21 can constitute a loop electromagnetic coil after the plurality of metal strips is supplied with a current, so that the metal rear cover 100 can achieve a near field radio frequency function, thus further improving the user experience.

Further, as illustrated in FIG. 1, the plurality of micro-seams 21 are arranged equidistantly, and a distance between two adjacent micro-seams 21 is greater than a seam width of the micro-seam 21. In some embodiments of the present disclosure, in each micro-seam 20, a ratio of a width between two adjacent micro-seams 21 to the seam width of the micro-seam 21 ranges from 1.5 to 2.0, so that a proportion of the micro-seams 21 is small and a user cannot distinguish the micro-seams by naked eyes, thus further improving an appearance effect of the metal rear cover 100 for the terminal.

In some embodiments of the present disclosure, the seam width of the micro-seam 21 is 0.05 mm to 0.3 mm, and the number of the micro-seams 21 is 5 to 10. A minimum of the seam width of the micro-seam 21 is ensured to be 0.05 mm, so that the micro-seam 21 cannot be directly distinguished by the user, and the lowest radio frequency efficiency of the metal rear cover 100 for the terminal can be ensured. Inversely, a maximum of the seam width of the micro-seam 21 is ensured to be 0.3 mm, so that the radio frequency efficiency of the metal rear cover 100 for the terminal can be improved. Similarly, a minimum of the number of the micro-seams 21 is controlled to be 5, so as to satisfy the appearance requirements of the metal rear cover 100 for the terminal, and a maximum of the number of the micro-seams 21 is controlled to be 10, so as to improve the radio frequency efficiency of the metal rear cover 100 for the terminal. The thickness of the base plate 10 is 0.5 mm to 1.5 mm, so that a thickness of the radiation part 30 is controlled to be 0.5 mm to 1.5 mm, an internal resistance impedance of the radiation part 30 can further be controlled, and a performance of the radiation part 30 being coupled to feeding can be improved, thereby improving the radio frequency efficiency of the metal rear cover 100 for the terminal. The width of the micro-seam band 20 is 1.5 mm to 5.0 mm, so that the proportion of the micro-seam band 20 to the entire metal rear cover 100 for the terminal is small, thereby improving the appearance effect of the metal rear cover 100 for the terminal.

Further, as illustrated in FIG. 1 again, in the first embodiment, the metal rear cover 100 for the terminal further includes a circumferential frame 40 fixed to the circumferential edge of the base plate 10, and the micro-seam band 20 runs through the circumferential frame 40. In some embodiments of the present disclosure, the circumferential frame 40 and the base plate 10 are integrally formed, and the circumferential frame 40 can protect a circumferential side of the terminal The micro-seam band 20 is formed by laser cutting the circumferential frame 40 and the base plate 10 sequentially, so that the micro-seam band 20 defines a clearance area, and further the radio frequency efficiency of the metal rear cover 100 for the terminal is improved.

In the first embodiment of the present disclosure, the metal rear cover 100 for the terminal further includes a light-transparent and signal non-shielding material completely filled in the micro-seam 21. When the metal rear cover 100 for the terminal is applied to the terminal, the terminal is provided with a breathing light (not illustrated) corresponding to the micro-seam band 20 in the terminal, so that the light-transparent and signal non-shielding material within the micro-seam 21 can transmit light rays of the breathing light, the user can see the light rays of the breathing light from outside of the metal rear cover 100 for the terminal, so as to understand an operation condition of the terminal, thus enhancing the appearance effect of the terminal and improving the user experience. More preferably, the light-transparent and signal non-shielding material employs a light guiding material, so that the micro-seam band 20 exhibits a light-band shape, and the appearance effect of the metal rear cover 100 for the terminal can be further improved.

Figure 4:
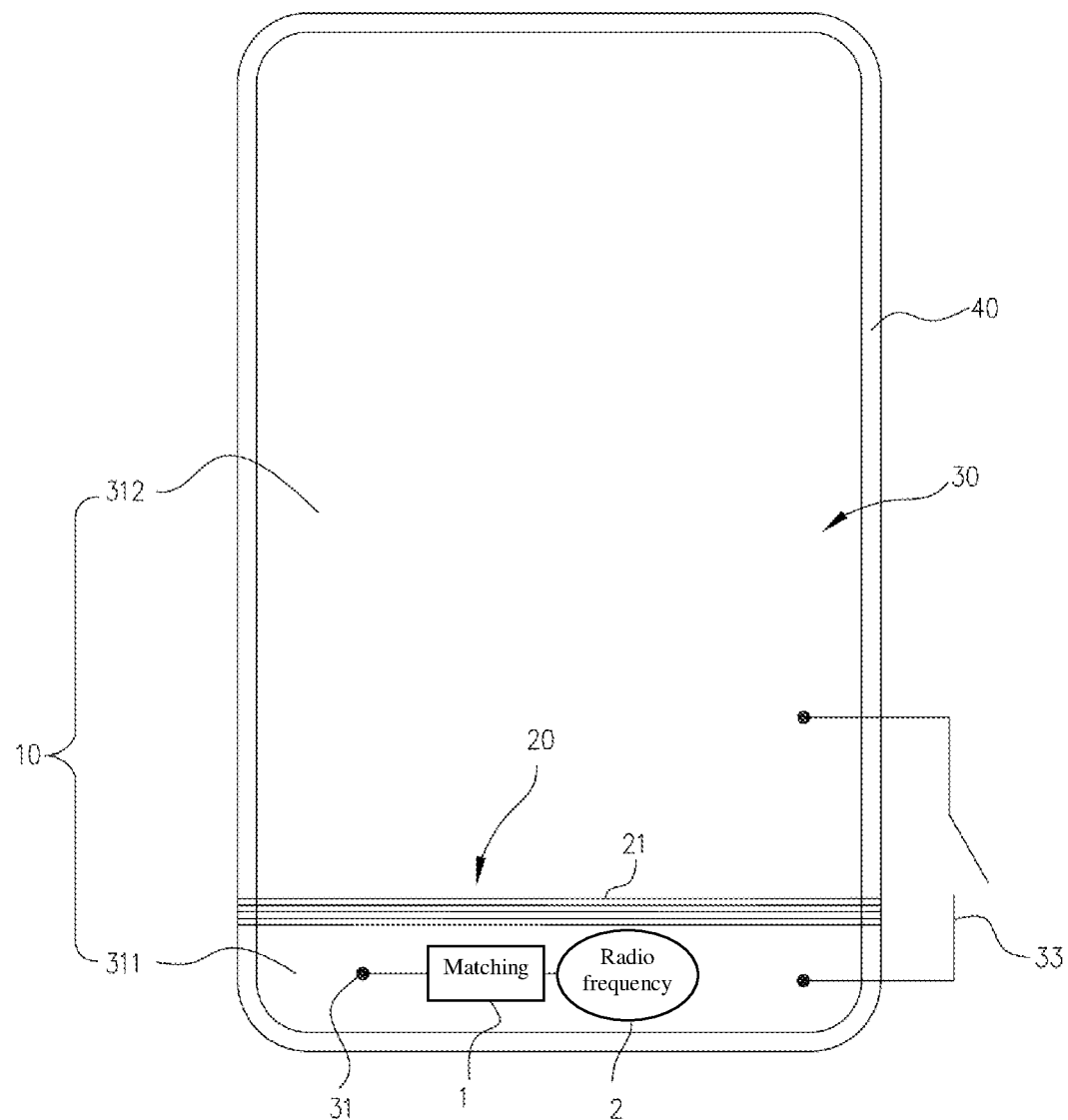
FIG. 4 is another schematic view of the metal rear cover for the terminal according to the first embodiment of the present disclosure.

Further, as illustrated in FIG. 4, a conducting switch 33 is coupled between the at least two radiation parts 30, and the conducting switch 33 is configured to connect or disconnect the at least two radiation parts 30. In the first embodiment of the present disclosure, the conducting switch 33 is coupled between the first radiation part 311 and the second radiation part 312. When the conducting switch 33 connects the first radiation part 311 with the second radiation part 312, the first radiation part 311 and the second radiation part 312 are both coupled to the feeding signal, so that the metal rear cover 100 for the terminal can achieve the transceiving of a first preset frequency range. When the conducting switch 33 disconnects the first radiation part 311 with the second radiation part 312, only the first radiation part 311 is coupled to the feeding signal, so that only the first radiation part 311 generates the radio frequency, that is, the metal rear cover 100 for the terminal can achieve the transceiving of a second preset frequency range. Therefore, by turning the conducting switch 33 off or on, a frequency selection function of the metal rear cover 100 for the terminal can be achieved, thus further improving the user experience.

The present disclosure further provides a terminal (not illustrated), the terminal includes the metal rear cover 100 for the terminal, and the terminal further includes a front cover (not illustrated) and a mainboard (not illustrated). The front cover and the metal rear cover 100 for the terminal cover each other and are coupled to each other, the mainboard is fixed between the front cover and the metal rear cover 100 for the terminal, and the mainboard is provided with the matching circuit electrically coupled to the radiation part 30. In some embodiments of the present disclosure, the terminal can be a mobile phone, a tablet computer, or a notebook computer.

In the metal rear cover for the terminal and the terminal according to the present disclosure, by providing the at least one micro-seam band to the base plate of the metal rear cover for the terminal, the at least one micro-seam band divides the base plate into the at least two radiation parts. By providing the micro-seam band with the plurality of micro-seams, a proportion of a non-metal portion of the metal rear cover for the terminal is reduced. At least one of the radiation parts is coupled to the matching circuit, to radiate the electromagnetic wave, such that the metal rear cover for the terminal itself can achieve a radio frequency of an antenna, and a radio frequency efficiency of the antenna is improved. Moreover, under the premise of satisfying overall appearance requirements of the terminal, the radio frequency efficiency of the antenna is improved, thereby improving a user experience.

The above reveals preferred embodiments of the present disclosure, it should be noted that, it is also possible for those skilled in the art to further make some improvements and modifications without departing from the principle of the present disclosure, and these improvements and modifications are deemed to fall into the scope of the present disclosure.

What is claimed is:

1. A metal rear cover for a terminal, comprising a base plate provided with at least one micro-seam band, the at least one micro-seam band comprising a plurality of micro-seams, the at least one micro-seam band dividing the base plate into at least two radiation parts, at least one of the at least two radiation parts being configured to be coupled to a matching circuit and to receive a feeding signal via the matching circuit, wherein the at least one micro-seam band comprises two micro-seam bands, the two micro-seam bands divide the base plate into a first radiation part, a second radiation part and a third radiation part arranged sequentially, the second radiation part is coupled with the first radiation part and the third radiation part, the first radiation part is coupled to a first matching circuit, and the third radiation part is coupled to a second matching circuit, wherein the first radiation part, the second radiation part and the third radiation part are grounded;

wherein the plurality of micro-seams are arranged equidistantly, wherein a distance between two adjacent micro-seams is greater than a width of the micro-seam, wherein the width of the micro-seam is 0.05 mm to 0.3 mm, wherein a thickness of the base plate is 0.5 mm to 1.5 mm, and wherein a width of the at least one micro-seam band is 1.5 mm to 5.0 mm.

2. The metal rear cover for the terminal according to claim 1, wherein the at least one micro-seam band divides the base plate along a direction parallel to a length direction or a width direction of the base plate.

3. The metal rear cover for the terminal according to claim 2, wherein one of the two micro-seam bands is adjacent to a first side edge of the base plate along the length direction of the base plate, and the other one of the two micro-seam bands is adjacent to a second side edge of the base plate opposite to the first side edge of the base plate.

4. The metal rear cover for the terminal according to claim 1, further comprising a circumferential frame fixed to a circumferential edge of the base plate, and the at least one micro-seam band passes through the circumferential frame.

5. The metal rear cover for the terminal according to claim 1, wherein the at least one micro-seam band further comprises a signal non-shielding material completely filled in the micro-seam.

6. The metal rear cover for the terminal according to claim 1, wherein the radiation part coupled to the matching circuit is provided with a feeding point, and the feeding point is electrically coupled to the matching circuit.

7. The metal rear cover for the terminal according to claim 1, further comprising:
  a conducting switch coupled between the at least two radiation parts, and configured to disconnect or connect the at least two radiation parts.

8. The metal rear cover for the terminal according to claim 7, wherein the metal rear cover for the terminal is configured to radiate at least two radio frequency ranges by means of the conducting switch disconnecting or connecting the at least two radiation parts.

* * * * *